(12) United States Patent
Shin et al.

(10) Patent No.: US 12,131,905 B2
(45) Date of Patent: Oct. 29, 2024

(54) GRAPHENE STRUCTURE AND METHOD OF FORMING THE GRAPHENE STRUCTURE

(71) Applicant: Samsung Electronics Co., Ltd., Suwon-si (KR)

(72) Inventors: Keunwook Shin, Yongin-si (KR); Kyungeun Byun, Seongnam-si (KR); Hyeonjin Shin, Suwon-si (KR); Soyoung Lee, Yongin-si (KR); Changseok Lee, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 159 days.

(21) Appl. No.: 16/923,478

(22) Filed: Jul. 8, 2020

(65) Prior Publication Data

US 2021/0210346 A1    Jul. 8, 2021

(30) Foreign Application Priority Data

Jan. 6, 2020    (KR) .................... 10-2020-0001570

(51) Int. Cl.
*H01L 21/02* (2006.01)
*C23C 16/26* (2006.01)
*C23C 16/50* (2006.01)
*H01L 29/16* (2006.01)

(52) U.S. Cl.
CPC ........ *H01L 21/02527* (2013.01); *C23C 16/26* (2013.01); *C23C 16/50* (2013.01); *H01L 21/02422* (2013.01); *H01L 21/02425* (2013.01); *H01L 21/0262* (2013.01); *H01L 29/1606* (2013.01)

(58) Field of Classification Search
CPC ........ H01L 21/02527; H01L 21/02422; H01L 21/02425; H01L 21/0262; H01L 21/02576; H01L 21/02579; H01L 21/02274; H01L 29/1606; H01L 29/0847; H01L 29/165; H01L 29/66621; H01L 29/78; C23C 16/26; C23C 16/50; C23C 16/505; C23C 16/511; C23C 16/56; C01P 2006/90; C01B 32/186
See application file for complete search history.

(56) References Cited

U.S. PATENT DOCUMENTS

| | | | | |
|---|---|---|---|---|
| 8,609,458 | B2* | 12/2013 | Gharib | H01L 21/02614 257/40 |
| 8,940,576 | B1* | 1/2015 | Bui | C01B 32/194 257/E21.042 |
| 9,096,437 | B2* | 8/2015 | Tour | C01B 32/184 |
| 9,187,824 | B2* | 11/2015 | Fisher | C01B 32/182 |
| 10,807,871 | B2* | 10/2020 | Choudhary | C01B 32/186 |
| 10,876,210 | B1* | 12/2020 | Claussen | H05K 1/092 |

(Continued)

FOREIGN PATENT DOCUMENTS

| | | |
|---|---|---|
| KR | 20130022565 A | 3/2013 |
| KR | 20150143133 A | 12/2015 |
| KR | 20200037638 A | 4/2020 |

*Primary Examiner* — Dale E Page
*Assistant Examiner* — Quovaunda Jefferson
(74) *Attorney, Agent, or Firm* — HARNESS, DICKEY & PIERCE, P.L.C.

(57) ABSTRACT

A graphene structure and a method of forming the graphene structure are provided. The graphene structure includes directly grown graphene that is directly grown on a surface of a substrate and has controlled surface energy.

26 Claims, 19 Drawing Sheets

(56) References Cited

U.S. PATENT DOCUMENTS

| | | | |
|---|---|---|---|
| 2011/0313194 A1* | 12/2011 | Lee | B82Y 30/00 |
| | | | 977/734 |
| 2012/0068161 A1* | 3/2012 | Lee | C01B 32/188 |
| | | | 977/734 |
| 2016/0059444 A1* | 3/2016 | Wang | C01B 32/205 |
| | | | 264/29.1 |
| 2016/0115032 A1* | 4/2016 | Wodtke | C01B 32/188 |
| | | | 205/291 |
| 2016/0245772 A1* | 8/2016 | Anderson | B05D 3/065 |
| 2018/0247816 A1* | 8/2018 | Sung | H01L 21/041 |
| 2018/0350915 A1* | 12/2018 | Shin | H01L 29/167 |
| 2020/0105524 A1 | 4/2020 | Shin et al. | |

* cited by examiner

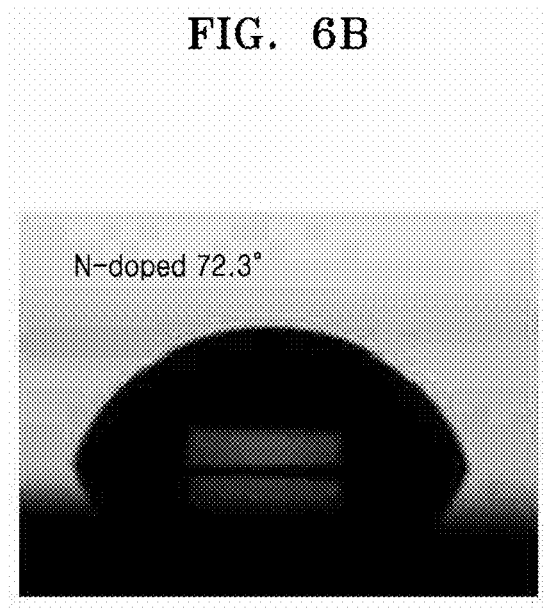

FIG. 8

| Substrate | Rs (ohm/sq) | Reduction (%) |
|---|---|---|
| As-is, undoped | 7.24 | -- |
| Ar+NH3 plasma treated | 7.09 | 2.1 |
| NH3 plasma treated | 7.03 | 2.9 |
| N doped | 6.8 | 6.0 |

GRAPHENE STRUCTURE AND METHOD OF FORMING THE GRAPHENE STRUCTURE

CROSS-REFERENCE TO RELATED APPLICATION

This application claims the benefit of Korean Patent Application No. 10-2020-0001570, filed on Jan. 6, 2020, in the Korean Intellectual Property Office, the disclosure of which is incorporated herein in its entirety by reference.

BACKGROUND

1. Field

The present disclosure relates to graphene structures directly grown on a surface of a substrate and methods of forming the graphene structures.

2. Description of Related Art

In semiconductor device field, resistance increases as the width of metal wiring decreases. Graphene is being actively researched in the semiconductor device field and research is being done to develop a new metal barrier material. Graphene is a material having a hexagonal honeycomb structure in which carbon atoms are connected two-dimensionally. Graphene also has a very thin thickness of an atomic size level. Such graphene has advantageous in terms of high electric mobility and excellent thermal characteristics compared to silicon Si. In addition, graphene has chemical stability, and large surface area. In order to apply graphene to semiconductor devices, it is advantageous in a process to directly grow graphene on a semiconductor substrate is advantageous.

SUMMARY

Provided are directly grown graphene structures having surface energy changed and methods of forming the directly grown graphene structures.

Additional aspects will be set forth in part in the description which follows and, in part, will be apparent from the description, or may be learned by practice of the presented embodiments of the disclosure.

According to an embodiment, a graphene structure includes a substrate and a directly grown graphene that is directly grown on a surface of the substrate and has a controlled surface energy.

In some embodiments, the controlled surface energy of the directly grown graphene may be an increased surface energy of the directly grown graphene.

In some embodiments, the directly grown graphene may have a domain size of greater than 0 nm and less than or equal to 100 nm.

In some embodiments, the directly grown graphene may include an N component.

In some embodiments, the graphene structure may further include a material layer on the directly grown graphene, where the material layer may include any one of a metal material and a dielectric material.

According to an embodiment, a method of forming a graphene structure includes preparing a substrate and directly growing graphene on a surface of the substrate using a plasma enhanced chemical vapor deposition (PECVD) process. The directly growing the graphene may include changing a surface energy of a graphene to provide a the directly grown graphene having a controlled surface energy.

In some embodiments, the directly growing graphene may include increasing the surface energy so the directly grown graphene has an increased surface energy.

In some embodiments, the changing the surface energy of the directly grown graphene may be performed by any one of injecting a doping gas during the directly growing graphene, performing a plasma treatment after the directly growing graphene, and performing an UV-ozone treatment after the directly growing graphene.

In some embodiments, the directly grown graphene may include an N component.

In some embodiments, the directly growing graphene may include injecting a doping gas containing the N component in the graphene during the directly growing graphene.

In some embodiments, the doping gas may include $NH_3$.

In some embodiments, after the directly grown graphene is formed, the surface energy of the directly grown graphene may be controlled by plasma treatment with a gas containing the N component.

In some embodiments, the gas containing the N component may include $NH_3$.

In some embodiments, the changing the surface energy of graphene may be performed during the directly growing graphene and may be controlled injecting a doping gas into the graphene to grow a doped graphene, the doping gas containing at least one of $NH_3$, $BH_3$, $B_2H_6$, $AsH_3$, $PH_3$, TMSb, TMIn, and TMGa.

In some embodiments, a doping concentration may be greater than 0% and less than or equal to 5% in the directly grown graphene.

In some embodiments, the method may further include controlling a surface energy of the directly grown graphene after the directly growing the graphene by using a plasma treatment with any one of $NH_3$, $H_2$, Ar, $O_2$, and two or more gas combinations thereof.

In some embodiments, the directly growing graphene is performed using a reaction gas including a mixed gas of carbon source gas, inert gas, and hydrogen gas.

In some embodiments, the directly grown graphene may have a domain size of greater than 0 nm and less than or equal to 100 nm.

In some embodiments, the method may further include forming a material layer including any one of a metal and a dielectric material on the directly grown graphene having controlled surface energy.

In some embodiments, the material layer may include a metal layer or a dielectric layer. The metal layer may include at least one of W, Cu, Al, Hf, Zr, Fe, Ru, Rh, Ir, Mo, Co, Cr, V, Nb, Ta, Ti, TaN, and TiN. The dielectric layer may include Si nitride or an oxide including at least one of Si, Ge, Al, Hf, Zr, and La.

According to an embodiment, a graphene structure includes a substrate and a directly grown graphene on a surface of the substrate. The directly grown graphene may have a water contact angle of less than or equal to about 75 degrees with respect to the surface of the substrate.

In some embodiments, the water contact angle of the directly grown graphene may be in a range of 20 degrees to 75 degrees with respect to the surface of the substrate.

In some embodiments, the directly grown graphene may have an N component.

In some embodiments, the graphene structure may further include a material layer on the directly grown graphene. The material layer may comprise a metal material or a dielectric material.

In some embodiments, an electronic device may include the graphene structure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6B shows a change in a water contact angle of directly grown graphene doped by injecting $NH_3$ gas during directly growing of graphene;

FIG. 8 shows resistance characteristics of a metal when depositing the metal on directly grown graphene;

DETAILED DESCRIPTION

Figure 1:
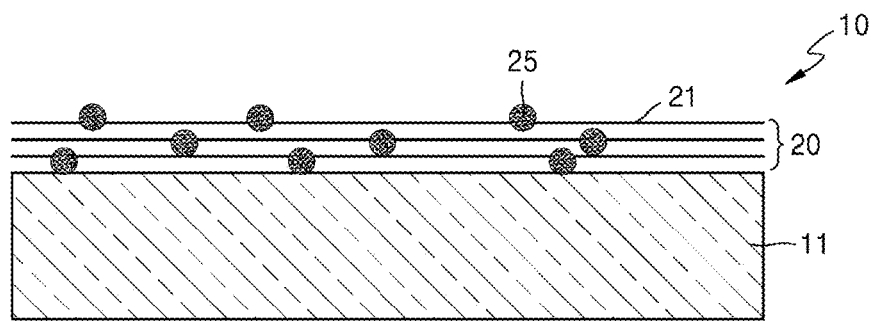
FIGS. 1 and 2 are schematic diagrams showing graphene structures according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings. In the drawings, like reference numerals refer to like elements and sizes of elements in the drawings may be exaggerated for convenience of explanation. The embodiments described below are merely examples, and various modifications are possible from these embodiments.

It will be understood that when an element or layer is referred to as being "on" or "above" another element or layer, the element or layer may be directly on another element or layer or intervening elements or layers. It will be understood that, although the terms "first", "second", etc. may be used herein to describe various elements, these terms are only used to distinguish one element from another element. These terms do not limit the difference of substance or structure of constituent elements. Singular forms are intended to include the plural forms as well, unless the context clearly indicates otherwise. It should be understood that, when a part "comprises" or "includes" an element in the specification, unless otherwise defined, other elements are not excluded from the part and the part may further include other elements. The term "above" and similar directional terms may be applied to both singular and plural.

With respect to operations that constitute a method, the operations may be performed in any appropriate sequence unless the sequence of operations is clearly described or unless the context clearly indicates otherwise. The operations may not necessarily be performed in the order of sequence. Examples, or the use of example terms provided herein, is intended merely to illuminate the spirit and does not pose a limitation on the scope unless otherwise claimed.

Graphene is a substance having a hexagonal honeycomb structure in which carbon atoms are two-dimensionally connected, and has a very thin thickness at an atomic size level. Compared to silicon Si, graphene has advantages of high electric mobility, excellent thermal characteristics, chemical stability, and large surface area, etc. The graphene may be used as a metal barrier. In order to introduce a semiconductor process, direct growth of graphene on a non-catalyst substrate is required. In order to increase the possibility of application of directly grown graphene to a metal barrier, it is needed that a resistance of a main metal material deposited on the directly grown graphene is lower than that of a main metal material deposited on a barrier metal of the related art.

In the following embodiments, a graphene structure having improved characteristics by directly growing and changing surface energy thereof and a method of forming the graphene will be described.

Figure 2:
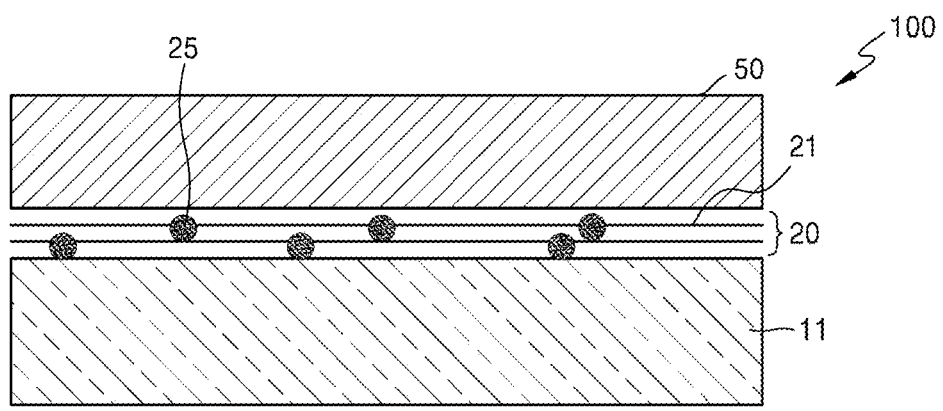

FIGS. 1 and 2 are schematic diagrams showing graphene structures 10 and 100 according to embodiments The graphene structure 100 of FIG. 2, compared to the graphene structure 10 of FIG. 1, further includes a material layer 50 on directly grown graphene 20 having controlled surface energy.

Referring to FIGS. 1 and 2, the graphene structure 10 and 100 according to the embodiments include a substrate 11 and the directly grown graphene 20 having controlled surface energy on a surface of the substrate 11. Also, as depicted in FIG. 2, the material layer 50 may be further formed on the directly grown graphene 20 having controlled surface energy.

The substrate 11 may include a semiconductor material, a metal material, or an insulating material. The substrate 11 may include, for example, a semiconductor material. The semiconductor material may include, for example, a Group IV semiconductor material or a semiconductor compound. As an example, the substrate 11 may include a Group IV semiconductor materials including at least one of Si, Ge, Sn, and C, a Group III-V compound semiconductor material in which at least one of B, Ga, In, and Al and at least one of N, P, As, Sb, S, Se, and Te are combined, or a Group II-VI compound semiconductor material in which at least one of Be, Mg, Cd, and Zn and at least one of O, S, Se, and Te are combined. The substrate 11 may include a metal material. The metal material may include, for example, at least one of Cu, Mo, Ni, Al, W, Ru, Co, Mn, Ti, Ta, Au, Hf, Zr, Zn, Y, Cr, Gd, Rh, Ir, Os, TiN and TaN. Also, the substrate 11 may include an insulating material. The insulating material may include, for example, oxides, nitrides, carbides, etc. As an example, the substrate 11 may include an oxide including at least one of Si, Ge, Al, Hf, Zr, and La, or Si nitride.

However, the materials of the substrate 11 described above are merely examples, and the substrate 11 may also include various other materials in addition to the above materials. The substrate 11 may further include a dopant. For example, when the substrate 11 includes a semiconductor material, the substrate 11 may be doped. For example, the substrate 11 includes a Group IV semiconductor material and may be mainly doped with, for example, B, P, As, etc. The substrate 11 may include a Group III-V semiconductor material and may be doped with, for example, Si, C, Te, Se, Mo, etc.

For example, the substrate 11 may include at least one of single crystalline silicon, amorphous silicon, polysilicon, and silicon oxide, or may include at least one of various semiconductor materials described above, semiconductor compounds, metal materials, and insulating materials.

The substrate 11 may be a base on which a wiring structure or an electronic device including the graphene structures 10 and 100 according to the embodiment is formed. Here, the substrate 11 may be pretreated before growing graphene.

In the present embodiment, directly grown graphene 21 is directly grown on a surface of the substrate 11, and surface energy thereof may be controlled, for example, to be increased. The directly grown graphene 21 may be formed to include nanocrystalline graphene having a domain size of 100 nm or less (e.g., greater than 0 nm and less than or equal to 100 nm).

In the present embodiment, the control of surface energy of the directly grown graphene 21 may be performed by any one of injecting a dopant gas during directly growing of graphene, performing a plasma treatment by using a plasma gas after directly growing of graphene, and performing an UV-ozone treatment after directly growing of graphene. For example, during directly growing of graphene, the directly grown graphene 21 doped with a dopant 25, for example, an N component may be formed by injecting a doping gas containing the N component. Also, after directly growing of graphene, the directly grown graphene 21 may be plasma treated with, for example, a gas containing the N component. Also, after directly growing of graphene, the directly grown graphene 21 may be UV-ozone treated. Besides above, after directly growing of graphene, the surface energy of the directly grown graphene 21 may be controlled through a post-treatment by using a wet chemical treatment, such as an HF treatment.

The surface energy of the directly grown graphene 21 may be changed by injecting a doping gas during directly growing of graphene or by performing subsequent processing after directly growing of graphene. The graphene structures 10 and 100 including the directly grown graphene 20 may be formed, wherein surface energy of the directly grown graphene 21 is controlled in an increasing direction to improve characteristics such as adhesion or resistance of the directly grown graphene 21.

Here, when the graphene structures 10 and 100 including the directly grown graphene 20 having controlled surface energy are formed by injecting the dopant 25 into the directly grown graphene 21, the concentration of the dopant 25 may be greater than 0% and less than or equal to 5%.

In FIGS. 1 and 2, as examples, the graphene structures 10 and 100 in which the directly grown graphene 20 having controlled surface energy are formed by doping with the dopant 25 into the directly grown graphene 21 are shown.

Meanwhile, the graphene structures 10 and 100 may further include a material layer 50 on the directly grown graphene 20 having controlled surface energy. When a conductive layer, such as a metal layer is formed as the material layer 50, the graphene structures 10 and 100 may be applied as a wiring structure. When a dielectric layer is formed as the material layer 50, the graphene structures 10 and 100 may constitute an electronic device, such as a capacitor. The material layer 50 may include a metal layer including, for example, at least one of W, Cu, Al, Hf, Zr, Fe, Ru, Rh, Ir, Mo, Co, Cr, V, Nb, Ta, Ti, TaN, and TiN. The material layer 50 may include a dielectric layer including Si nitride or an oxide including, for example, at least one of Si, Ge, Al, Hf, Zr, and La. In the graphene structures 10 and 100 according to embodiments, the directly grown graphene 20 having controlled surface energy in an increasing direction may perform as a diffusion barrier with respect to a conductive material, adhesion between the substrate 11 and the directly grown graphene 21 and the directly grown graphene 21 and the material layer 50 formed thereon may be increased by the surface energy control, resistance characteristics of the material layer 50 formed on the directly grown graphene 21 may be improved, as a result, the issue from an increase in resistance due to the decrease in a width of a metal wiring may be limited.

FIGS. 3A to 3D show a process of forming a graphene structure 200 according to an embodiment. FIGS. 3A to 3D illustrate an embodiment in which a doping gas is injected during directly growing of graphene to control surface energy of a directly grown graphene 121.

Referring to FIGS. 3A to 3D, according to the method for forming the graphene structure 200 according to an embodiment, a substrate 110 is prepared, the directly grown graphene 121 is grown by using a plasma enhanced chemical vapor deposition (PECVD) process on a surface of the substrate 110, and a directly grown graphene 120 having controlled surface energy may be formed by doping a dopant 125.

Figure 3A:
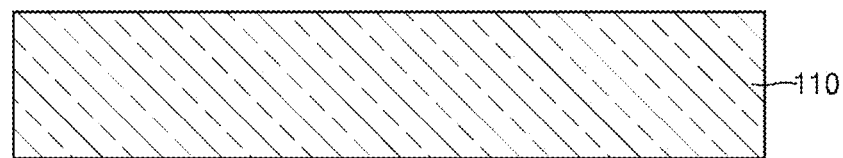
FIGS. 3A to 3D are diagrams showing a process of forming a graphene structure according to an embodiment.

In order to form the graphene structure 200, first, the substrate 110 as shown in FIG. 3A is prepared in a reaction chamber (not shown).

The substrate 110 may include a semiconductor material, a conductive material, or an insulating material. The substrate 110 may include, for example, a semiconductor material. The semiconductor material may include, for example, a group IV semiconductor material, or a semiconductor compound. As an example, the substrate 110 may include a Group IV semiconductor materials including at least one of Si, Ge, Sn, and C, a Group III-V compound semiconductor material in which at least one of B, Ga, In, and Al and at least one of N, P, As, Sb, S, Se, and Te are combined, or a Group II-VI compound semiconductor material in which at least one of Be, Mg, Cd, and Zn and at least one of O, S, Se, and Te are combined. The substrate 110 may include a conductive material. The conductive material may include, for example, at least one of Cu, Mo, Ni, Al, W, Ru, Co, Mn, Ti, Ta, Au, Hf, Zr, Zn, Y, Cr, Gd, Rh, Ir, Os, TiN and TaN. Also, the substrate 110 may include an insulating material. The insulating material may include, for example, oxides, nitrides, or carbides, etc. As an example, the substrate 110 may include an oxide including at least one of Si, Ge, Al, Hf, Zr, and La, or Si nitride. However, the materials of the substrate 110 described above are merely examples, and the substrate 110 may also include various other materials. The substrate 110 may further include a dopant. For example, when the substrate 110 includes a semiconductor material, the substrate 110 may be doped. For example, the substrate 110 includes a Group IV semiconductor material and may be mainly doped with, for example, B, P, As, etc. The substrate 110 may include a Group III-V semiconductor material and may be doped with, for example, Si, C, Te, Se, Mo, etc.

For example, the substrate 110 may include at least one of single crystalline silicon, amorphous silicon, polysilicon, and silicon oxide, and may include at least one of various semiconductor materials described above, various semiconductor compounds described above, various conductive materials described above, and various insulating materials described above.

The substrate 110 may be pretreated before growing graphene. In the pretreatment process of the substrate 110, a pretreatment gas injected for plasma generation inside the reaction chamber may include, for example, at least one of an inert gas, hydrogen, oxygen, ammonia, chlorine, bromine, fluorine, and fluorocarbon. Here, the inert gas may include, for example, at least one of argon gas, neon gas, nitrogen gas, helium gas, krypton gas, and xenon gas. Charges formed on a surface of the substrate 110 by applying plasma power in a state that a bias is applied to the substrate 110 may induce adsorption of activated carbon in a process of growing graphene. Also, when gas plasma is generated by applying plasma power while a bias is applied to the substrate 110, an activation site for inducing adsorption of activated carbon may be formed on the surface of the substrate 110.

Figure 3B:
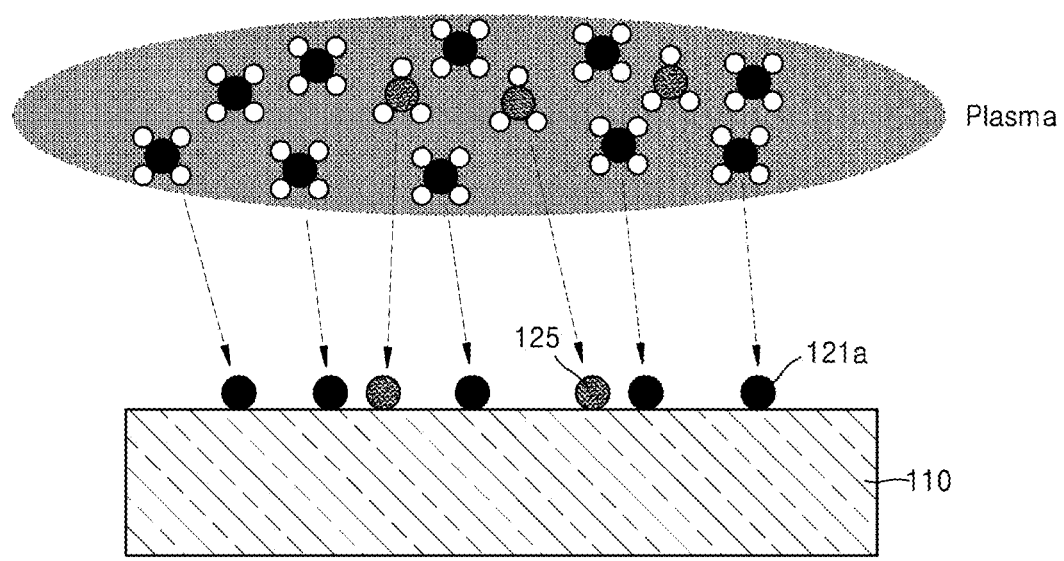
Figure 3C:
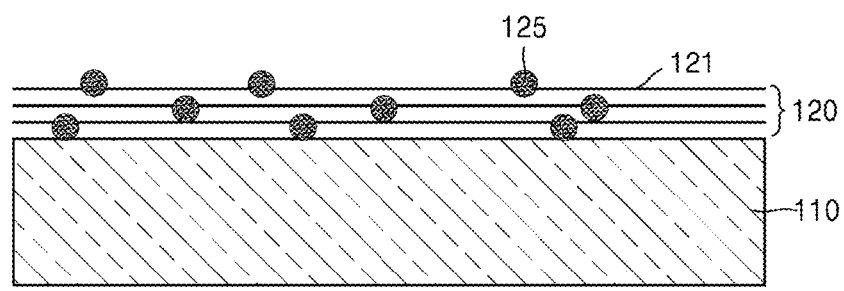

In this way, in a state that the substrate 110 is prepared in a reaction chamber, a plasma enhanced chemical vapor deposition (PECVD) process as shown in FIGS. 3B and 3C may be performed to directly grow graphene on the surface of the substrate 110.

In order to directly grow graphene on the surface of the substrate 110, a reaction gas for growing graphene may be injected into the reaction chamber.

The reaction gas may include a carbon source. Here, the carbon source may be a source for supplying carbon for graphene growth. The carbon source may include, for example, at least one of a hydrocarbon gas and a vapor of a liquid precursor including carbon. Here, the hydrocarbon gas may include, for example, methane gas, ethylene gas, acetylene gas, or propylene gas. In addition, the liquid precursor including carbon may include, for example, benzene, toluene, xylene, anisole, hexane, octane, isopropyl alcohol, or ethanol, etc. However, the above-mentioned carbon source material is merely examples and various other materials may be used as the carbon source material.

The reaction gas may further include at least one of an inert gas and a hydrogen gas. The inert gas may include, for example, at least one of argon gas, neon gas, nitrogen gas, helium gas, krypton gas, and xenon gas.

For example, for directly growing graphene, a mixed gas of carbon source gas, inert gas, and hydrogen gas may be used as the reaction gas. The mixing ratio of the reaction gas injected into the reaction chamber may be variously modified according to graphene growth conditions.

In order to control surface energy of the graphene directly grown on the surface of the substrate 110, a doping gas may be injected into the reaction chamber in addition to the reaction gas during directly growing graphene. In this case, the doping gas may include at least one of $NH_3$, $BH_3$, $B_2H_6$, $AsH_3$, $PH_3$, TMSb, TMIn, and TMGa.

On the other hand, for directly growing of graphene by using a PECVD process, power for plasma generation may be applied to an inside of the reaction chamber from a plasma power source (not shown). The plasma power applied to the inside of the reaction chamber in a process of growing graphene may be, for example, relatively small compared to the plasma power applied in the pretreatment process of the substrate 110. For example, the plasma power applied to the inside of the reaction chamber in the process of growing graphene may be less than 600 W, for example, 300 W or less and greater than 0 W. Here, the plasma power applied in the process of growing graphene is not limited thereto, and various powers may be applied.

As the plasma power source, for example, an RF plasma generator or an MW plasma generator may be used. The RF plasma generator may generate, for example, an RF plasma having a frequency band of approximately 3 MHz to 100 MHz. The MW plasma generator may generate, for example, an MW plasma having a frequency band of approximately 0.7 GHz to 2.5 GHz. However, the frequency bands are merely example and other frequency bands may be used. Meanwhile, a plurality of RF plasma generators or a plurality of MW plasma generators may be used as the plasma power source.

When power for generating plasma is applied to the reaction chamber from the plasma power source, plasma of the reaction gas may be generated inside the reaction chamber. Also, plasma of a doping gas may be generated inside the reaction chamber.

When power for plasma generation is applied from the plasma power source to the reaction chamber, as shown in FIG. 3B, plasma of carbon precursor (C-precursor) and dopant precursors may be generated in the reaction chamber. FIG. 3B as an example shows a case in which the directly grown graphene 121 doped with the dopant 125 is formed on the surface of the substrate 110 by plasma including C-precursors and dopant precursors ($NH_3$) for graphene growth. In FIG. 3B, reference numeral 121a denotes an activated carbon component forming directly grown graphene. Also, as illustrated in FIG. 3B, when the doping gas includes $NH_3$, the dopant 125 may correspond to an N component.

In the process of growing the directly grown graphene 121, a process temperature and a process pressure inside the reaction chamber may be variously modified according to the growth conditions of graphene. For example, the process of growing the directly grown graphene 121 may be performed at a relatively low temperature similar to the pretreatment process of the substrate 110. For example, the process of growing the directly grown graphene 121 may be performed at a process temperature of about 1000 degrees or less. As an example, the process of growing the directly grown graphene 121 may be performed at a process temperature of about 700 degrees or less (for example, about 300 degrees to 600 degrees).

A process pressure at which the process of growing the directly grown graphene 121 is performed may be higher than, for example, the process pressure at which the pretreatment process of the substrate 110 is performed. However, the embodiment is not limited thereto, and the process pressure in which the process of growing the directly grown graphene 121 is performed may be variously changed according to the growth conditions of graphene.

When plasma power is applied to the reaction chamber, the C-precursor and the dopant precursor (for example, $NH_3$) are activated by plasma of the reaction gas and the activated carbon 121a and the dopant 125 are moved towards the surface of the substrate 110, and thus, as shown in FIG. 3C, the directly grown graphene 121 may be formed by doping the dopant 125 into the directly grown graphene 120 having controlled surface energy.

At this time, when the dopant 125 is injected into the directly grown graphene 121 to form a graphene structure 200 including the directly grown graphene 120 having controlled surface energy, the concentration of the dopant 125 may be greater than 0% and less than or equal to 5%. Also, the directly grown graphene 121 may be formed to include nanocrystalline graphene having a domain size of about 100 nm or less and greater than 0 nm.

Figure 3D:
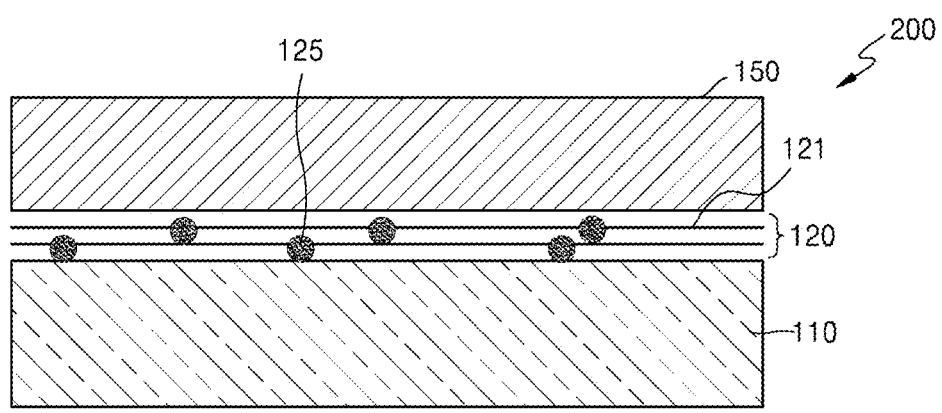

In a state that the directly grown graphene 120 is directly grown to a desired and/or alternatively predetermined thickness and the surface energy thereof is controlled by doping the dopant 125, as shown in FIG. 3D, a material layer 150 may be further formed. The graphene structure 200 may further include the material layer 150 on the directly grown graphene 120 having controlled surface energy in this way.

When a conductive layer, such as a metal layer is formed as the material layer 150, the graphene structure 200 may be applied as a wiring structure. When a dielectric layer is formed as the material layer 150, the graphene structure 200 may configure an electronic device, such as a capacitor or transistor, but not limited thereto. The material layer 150 may include a metal layer including, for example, at least any one of W, Cu, Al, Hf, Zr, Fe, Ru, Rh, Ir, Mo, Co, Cr, V, Nb, Ta, Ti, TaN, and TiN. The material layer 50 may include a dielectric layer including Si nitride or an oxide including, for example, at least one of Si, Ge, Al, Hf, Zr, and La.

According to the graphene structure 200 formed by the manufacturing method according to an embodiment, the surface energy of the directly grown graphene 121 is controlled to increase by doping with the dopant 125, and thus, adhesion between the directly grown graphene 121 and the material layer 150 may be increased and resistance characteristics of the material layer 150 formed on the directly grown graphene 121 may be improved. As a result, the issue from an increase in resistance due to the decrease in a width of a metal wiring may be limited.

With reference to FIGS. 3A to 3D, an example embodiment has been shown in which, in order to control the surface energy of the directly grown graphene 121, the directly grown graphene 121 is doped with the dopant 125 by injecting a doping gas during directly growing graphene. As another example, the surface energy of the directly grown graphene 121 may be controlled through a subsequent treatment process after directly growing graphene.

FIGS. 4A to 4E illustrate a process of forming a graphene structure 300 according to another embodiment. FIGS. 4A to 4E are diagrams illustrating an embodiment in which a plasma treatment process is performed after directly growing graphene in order to control surface energy of the directly grown graphene 121. Here, same or similar components as in FIGS. 3A to 3D are denoted by the same reference numerals and repeated descriptions thereof are omitted as much as possible.

Figure 4A:
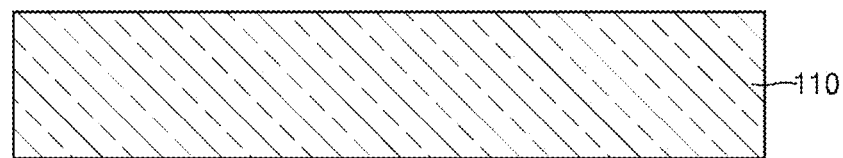
FIGS. 4A to 4E are diagrams showing a process of forming a graphene structure according to another embodiment.

Referring to FIG. 4A, first, for forming a graphene structure 300, a substrate 110 is prepared in a reaction chamber. As described above, the substrate 110 may include a semiconductor material, a conductive material, or an insulating material. Also, as described above, the substrate 110 may be pretreated before graphene growth.

Figure 4B:
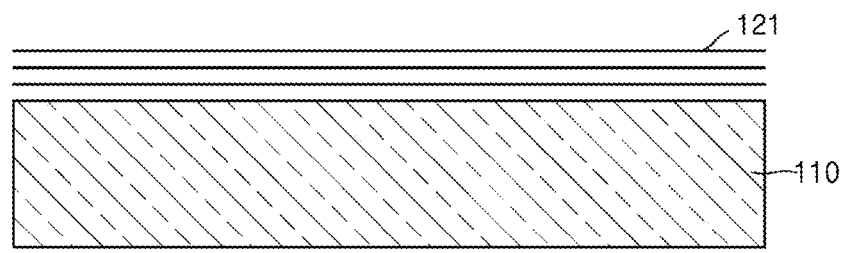

As described above, in a state that the substrate 110 is prepared in the reaction chamber, as shown in FIG. 4B, the directly grown graphene 121 may be grown on a surface of the substrate 110 by performing a PECVD process.

In order to grow the directly grown graphene 121 on the surface of the substrate 110, a reaction gas for growing graphene may be injected into the reaction chamber. At this point, the reaction gas may include a carbon source as described above. Also, the reaction gas may further include at least one of an inert gas and hydrogen gas as described above.

For example, in order to grow the directly grown graphene 121, a mixture gas of a carbon source gas, an inert gas, and hydrogen gas may be used as the reaction gas. The mixing ratio of the reaction gas injected into the reaction chamber may be variously modified according to graphene growth conditions.

In order to grow the directly grown graphene 121 on the surface of the substrate 110 by using a PECVD process, power for generating plasma may be applied from a plasma power source (not shown) to an inside of the reaction chamber. As described above, the plasma power applied in the growth process of the directly grown graphene 121 may be, for example, relatively smaller than the plasma power applied in the pretreatment process of the substrate 110.

When power for generating plasma is applied to the reaction chamber from the plasma power source, plasma of the reaction gas may be generated inside the reaction chamber. When power for plasma generation is applied from the plasma power source to the reaction chamber, C-precursor plasma may be generated in the reaction chamber, and, as shown in FIG. 4B, the directly grown graphene 121 may be grown on the surface of the substrate 110 by the C-precursor plasma. In the process of growing the directly grown graphene 121, the process temperature and the process pressure inside the reaction chamber may be variously modified according to the growth conditions of the graphene. For example, as described above, the process of growing the directly grown graphene 121 may be performed at a relatively low temperature similarly to the pretreatment process of the substrate 110. A process pressure at which the process of growing the directly grown graphene 121 is performed may be higher than, for example, as described above, a process pressure at which the pretreatment process of the substrate 110 is performed. However, the embodiment is not limited thereto, and the process pressure at which the growth process of the directly grown graphene 121 is performed may be variously modified according to the growth conditions of the graphene.

Figure 4C:
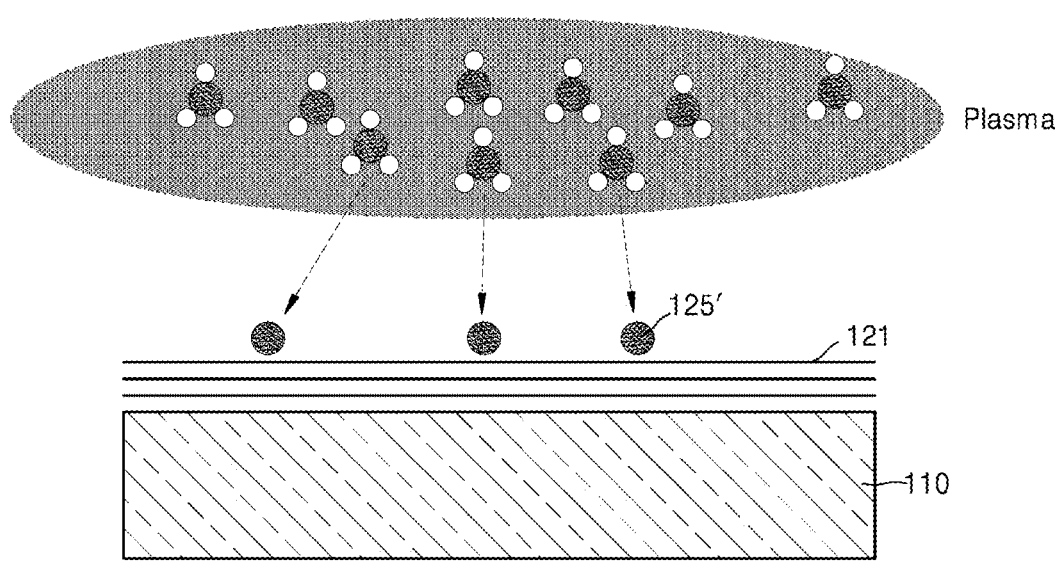

Referring to FIG. 4C, in a state that the directly grown graphene 121 is grown to have a desired and/or alternatively predetermined thickness, a gas for plasma treating the directly grown graphene 121 may be injected into the reaction chamber to control surface energy of the directly grown graphene 121. At this point, the gas used to the plasma treatment may be any one of $NH_3$, $H_2$, Ar, $O_2$ and a combination of two or more thereof. At this point, the gas may be activated to a plasma state by applying plasma power inside the reaction chamber, and the directly grown graphene 121 may be plasma treated, so that the surface energy thereof may be changed, for example, in an increasing direction. In this way, when the directly grown graphene 121 is plasma treated, as shown in FIG. 4D, the directly grown graphene 220 having controlled surface energy to be increased may be obtained.

Figure 4D:
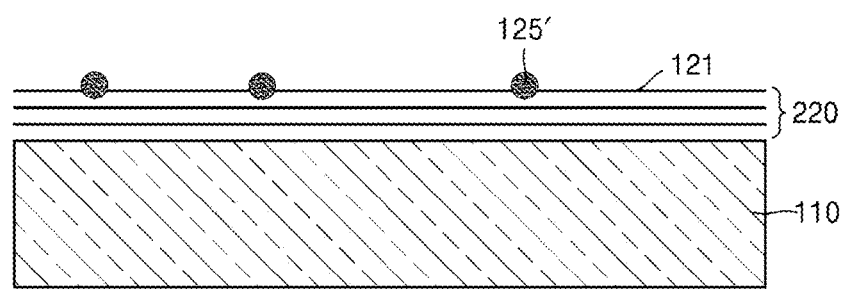

For example, as shown in FIG. 4D, directly grown graphene 220 having controlled surface energy may be formed by controlling the surface energy of the directly grown graphene 121 by plasma treatment with a gas containing N component.

In FIGS. 4C and 4D, reference numeral 125' denotes a main component, for example, an N component of a gas used in the plasma treatment of the directly grown graphene 121.

Figure 4E:
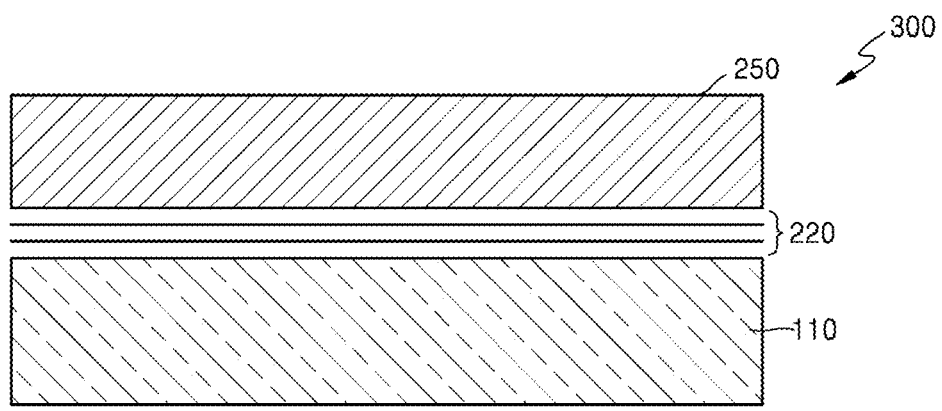

In this way, in a state that the directly grown graphene 220 having controlled surface energy is formed, as shown in FIG. 4E, a material layer 250 may further be formed on the directly grown graphene 220 having controlled surface energy. The graphene structure 300 may further include the material layer 250 on the directly grown graphene 120 having controlled surface energy in this way. For example, the material layer 250 may include a metal layer including at least one of W, Cu, Al, Hf, Zr, Fe, Ru, Rh, Ir, Mo, Co, Cr, V, Nb, Ta, Ti, TaN, and TiN. The material layer 250 may include, for example, a dielectric layer including Si nitride or an oxide including at least one of Si, Ge, Al, Hf, Zr, and La.

When a conductive layer, such as a metal layer is formed as the material layer 250, the graphene structure 300 may be applied as a wiring structure. When a dielectric layer is formed as the material layer 250, the graphene structure 300 may configure an electronic device, such as a capacitor.

According to the graphene structure 300 formed by the manufacturing method according to an embodiment, after growing of the directly grown graphene 121, a surface energy of the directly grown graphene 220 may be controlled in an increasing direction so that the directly grown graphene 121 having controlled surface energy is formed, and thus adhesion between the directly grown graphene 121 and the material layer 250 may increase and resistance characteristics of the material layer 250 formed on the directly growth graphene 121 may be improved. As a result, the issue from an increase in resistance due to the decrease in a width of a metal wiring may be limited.

With reference to FIGS. 4A to 4E, a case of controlling the surface energy of the directly grown graphene 121 to be increased by plasma treatment after growing of the directly grown graphene 121 has been described as an example. However, other methods besides the plasma treatment may be applied to control the surface energy of directly grown graphene 121, for example, to be increased. For example, after directly growing of graphene, the surface energy of the directly grown graphene 121 may be controlled by UV-ozone treatment. Also, the surface energy of the directly grown graphene 121 may be changed through a post-treatment, by using a wet chemical treatment, such as HF after directly growing of graphene.

Figure 11:
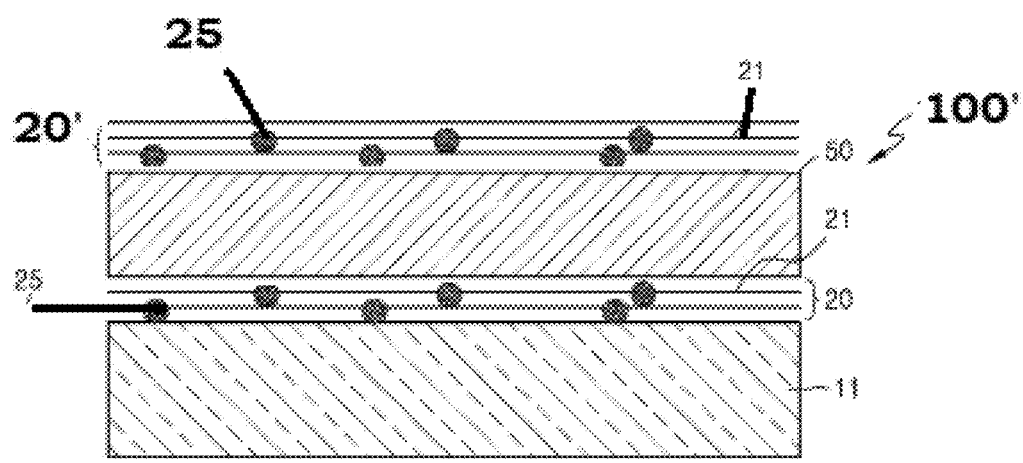
FIGS. 11-12 are schematic diagrams showing electronic devices according to example embodiments.
Figure 12:
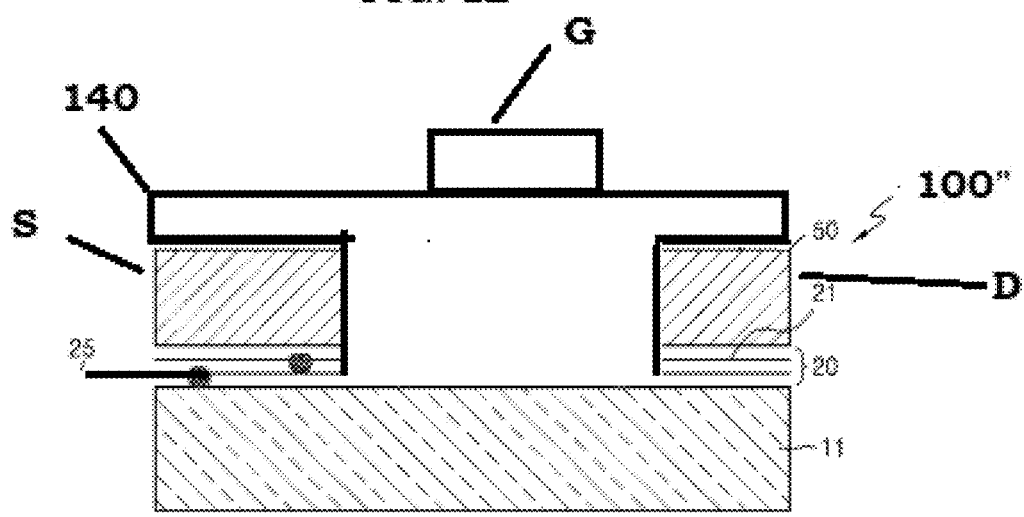

Graphene structures according to example embodiments may be applied to various electronic devices such as a capacitor, transistor, and the like. For example, as depicted in FIG. 11, the graphene structure 100 of FIG. 2 may include a dielectric layer (e.g., silicon oxide) as the material layer 50 and may be modified further to provide a capacitor 100' by forming another graphene layer 20' on top of the material layer 50. The graphene layers 20 and 20' may be formed using the same or different processes. Alternatively, as depicted in FIG. 12, the graphene structure 100 of FIG. 2 may include a conductive layer (e.g., metal layer) as the material layer 50 and may be modified to provide an electronic device 100" such as a transistor. A portion of the material layer 50 and graphene layer 20 may be patterned to provide a source electrode S and a drain electrode D spaced apart from each other on the substrate 11. Then a gate dielectric layer 140 (e.g., silicon oxide) and a gate electrode G may be formed on the source electrode S, drain electrode D, and substrate 11. The substrate 11 may be a semiconductor and a portion of the substrate below the gate electrode G may provide a channel between the source electrode S and drain electrode D.

Figure 5:
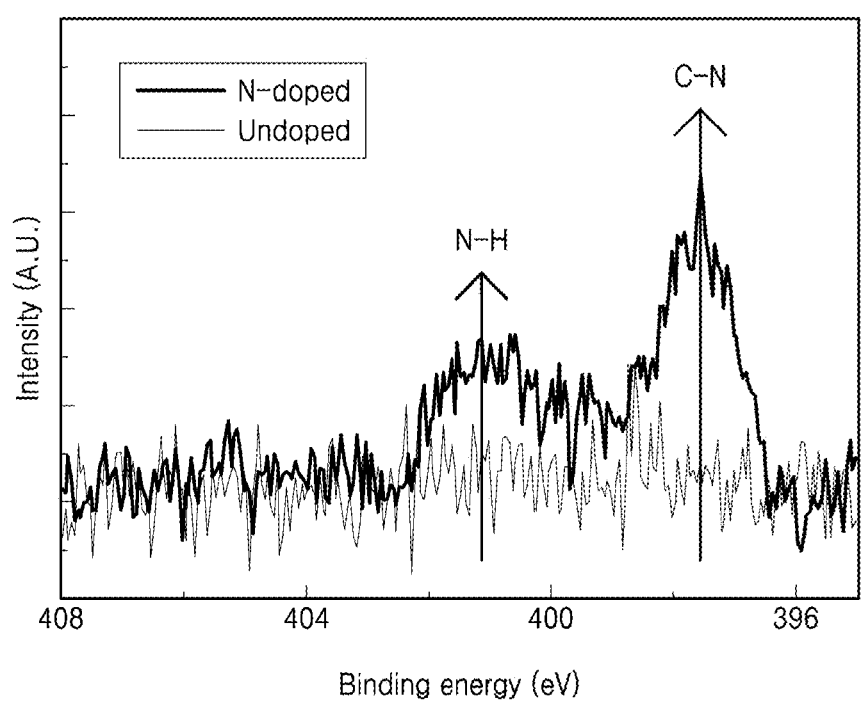
FIG. 5 is a graph showing a comparison of analysis results with regard to non-doped directly grown graphene and directly grown graphene doped by injecting $NH_3$ gas during forming of directly grown graphene.

FIG. 5 is a graph showing the comparison of analysis results of non-doped directly grown graphene and directly grown graphene doped by injecting $NH_3$ gas during directly growing graphene.

As shown in FIG. 5, when an $NH_3$ gas is injected during directly growing graphene, it may be seen that C—N bond exists.

Figure 6A:
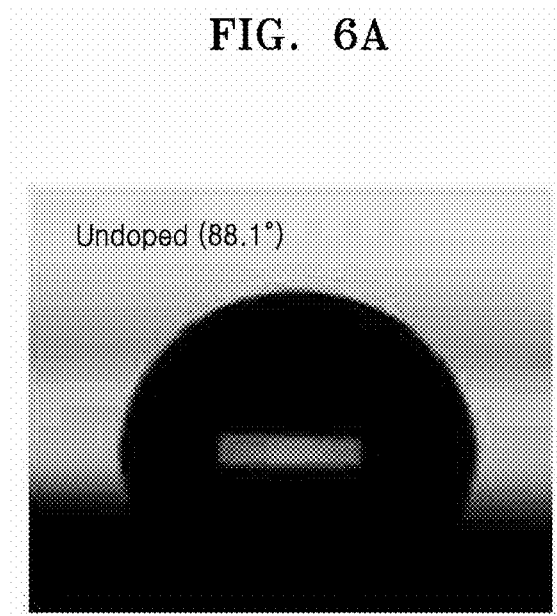
FIG. 6A shows a water contact angle with respect to non-doped directly grown graphene.

FIG. 6A shows a water contact angle with respect to non-doped directly grown graphene, and FIG. 6B shows the change in a water contact angle of directly grown graphene doped by injecting $NH_3$ gas during directly growing graphene.

As may be seen by comparing FIGS. 6A and 6B, in the case of the non-doped directly grown graphene, the water contact angle is 88.1 degrees. However, the water contact angle of the directly grown graphene doped by injecting $NH_3$ gas during graphene directly grown is 72.3 degrees. Thus, it may be seen that the surface energy is changed when the doped directly grown graphene is formed by injecting a doping gas during directly growing graphene. The decrease in water contact angle may correspond to the increase in surface energy.

Accordingly, it may be seen that when doped directly grown graphene is formed by injecting a doping gas during graphene directly grown, the surface energy of the directly grown graphene is controlled to be increased.

Figure 7:
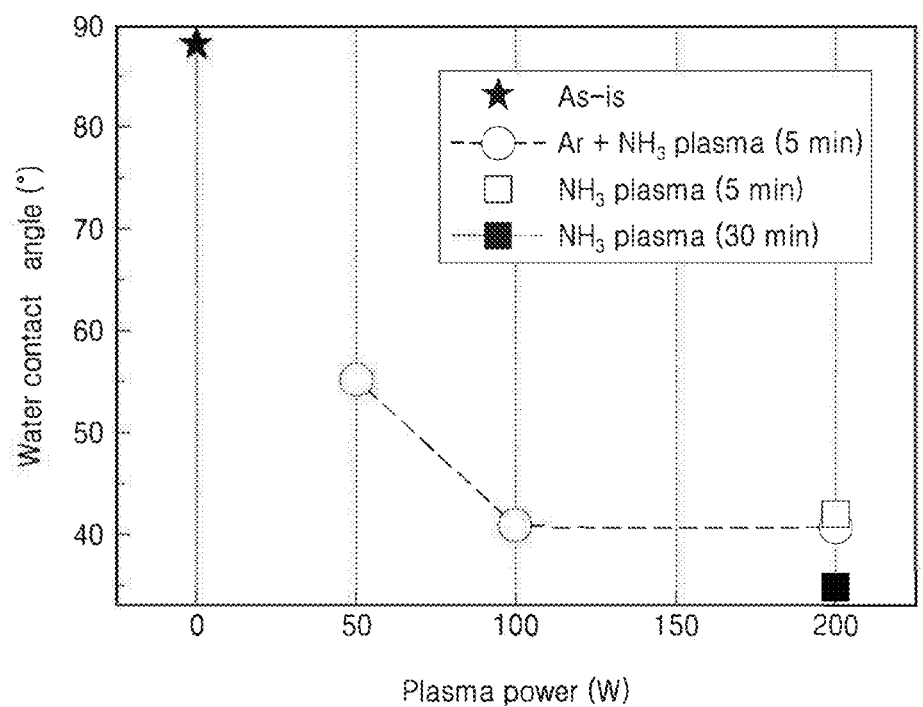
FIG. 7 is a graph showing a change in a water contact angle of directly grown graphene when the directly grown graphene is plasma treated with $NH_3$ gas after directly growing of graphene.

FIG. 7 is a graph showing the change in water contact angle of directly grown graphene when the directly grown graphene is plasma treated with $NH_3$ gas after directly growing of graphene.

As seen in FIG. 7, during plasma treatment, as the plasma power increases, the water contact angle of the directly grown graphene may decrease, and the water contact angle of the directly grown graphene may decrease by increasing the plasma treatment time. Here, the decrease in water contact angle may correspond to an increase in surface energy.

Accordingly, it may be seen that even through plasma treatment after directly growing of graphene, the surface energy of the directly grown graphene may be controlled to be increased.

FIG. 8 shows resistance characteristics of a metal when depositing the metal on directly grown graphene.

Referring to FIG. 8, compared with a case when directly grown graphene is not doped, when the directly grown graphene is doped with an N component during graphene directly grown or when the directly grown graphene is plasma treated by using $Ar+NH_3$, $NH_3$ gas after directly growing of graphene, it may be seen that the resistance of a metal decreases.

In this way, when doped directly grown graphene is formed by injecting a doping gas during directly growing graphene, or when the directly grown graphene is plasma treated after directly growing of graphene, surface energy of the directly grown graphene may be controlled to be increased, and thus, the resistance of a metal may be reduced when the metal is deposited on the directly grown graphene.

Figure 9:
FIGS. 9 and 10 show a change in a water contact angle of directly grown graphene when the directly grown graphene is UV-ozone treated after directly growing of graphene.
Figure 10:
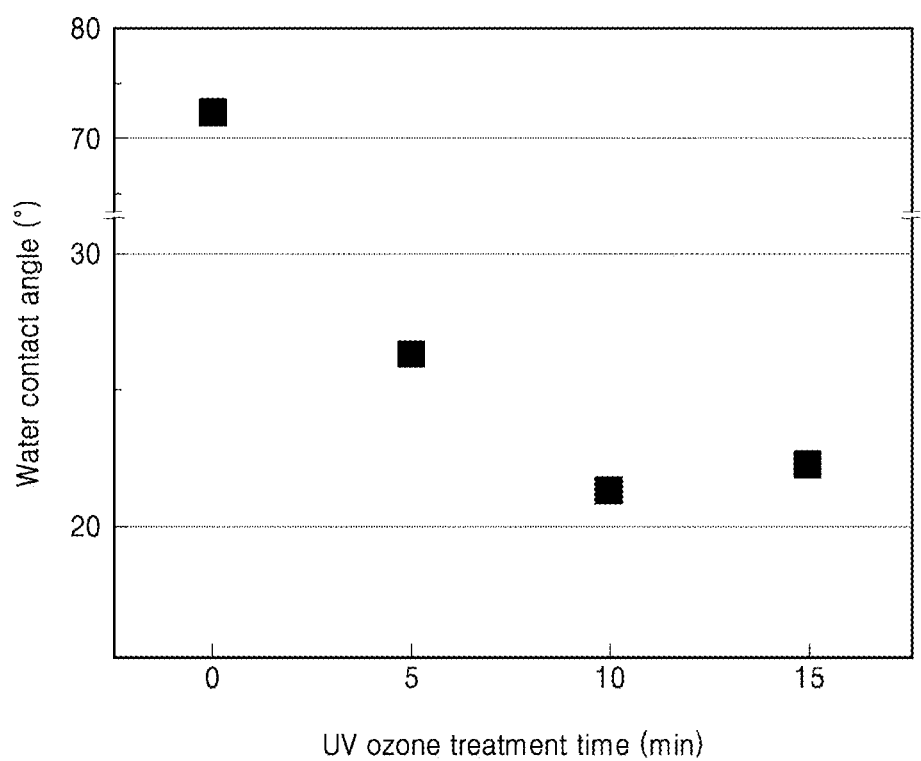

FIGS. 9 and 10 show the change in water contact angle of directly grown graphene when the directly grown graphene is UV-ozone treated after directly growing of graphene.

As may be seen in FIG. 9, even when the directly grown graphene is UV-ozone treated, the water contact angle of the directly grown graphene may be decreased. Also, as shown in FIG. 10, it may be seen that the water contact angle of the directly grown graphene also decreases with the time of UV-ozone treatment. As described above, the decrease in water contact angle may correspond to the increase in surface energy.

Accordingly, even when UV-ozone treatment is performed after directly growing of graphene, the surface energy of the directly grown graphene may be controlled to be increased.

As described above, the surface energy of the directly grown graphene may be controlled, for example, to be increased by any one of injecting a doping gas during directly growing graphene, performing a plasma treatment after directly growing of graphene, and performing an UV-ozone treatment after directly growing of graphene. As a result, adhesion between the directly grown graphene and a material layer may be increased, and resistance characteristics of the material layer formed on the directly grown graphene may be improved, and thus the issue from an increase in resistance due to the decrease in a width of a metal wiring may be limited.

According to the graphene structure and the method of forming the graphene structure according to example embodiments, the graphene structure including the directly grown graphene in which characteristics, such as adhesion or resistance are improved by controlling surface energy of the directly grown graphene, may be formed.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A graphene structure comprising:
   a substrate,
   a material of the substrate including a semiconductor material, a metal material, or an inorganic insulating material; and
   a directly grown graphene that is directly grown on a surface of the substrate and has a controlled surface energy, wherein
   the directly grown graphene has a water contact angle of less than or equal to about 60 degrees with respect to the surface of the substrate, and
   the directly grown graphene is directly on the material of the substrate such that the directly grown graphene is in contact with the semiconductor material, the metal material, or the inorganic insulating material of the substrate, and
   the directly grown graphene has a domain size of greater than 0 nm and less than or equal to 100 nm.

2. The graphene structure of claim 1, wherein the controlled surface energy of the directly grown graphene is an increased surface energy of the directly grown graphene.

3. The graphene structure of claim 1, wherein the directly grown graphene comprises an N component.

4. The graphene structure of claim 1, further comprising:
   a material layer on the directly grown graphene, wherein the material layer comprises a metal material layer or a dielectric material layer.

5. The graphene structure of claim 1, wherein the water contact angle of the directly grown graphene is in a range of 20 degrees to 60 degrees with respect to the surface of the substrate.

6. An electronic device comprising:
   the graphene structure of claim 1.

7. The graphene structure of claim 1, wherein
   the directly grown graphene is doped,
   a doping concentration in the directly grown graphene is greater than 0% and less than or equal to 5%, and
   a dopant in the directly grown graphene includes an N component or a B component, provided the dopant does not include both the N component and the B component.

8. The graphene structure of claim 1, wherein the metal material includes at least one of Cu, Mo, Ni, Al, W, Ru, Co, Mn, Ti, Ta, Au, Hf, Zr, Zn, Y, Cr, Gd, Rh, Ir, Os, TiN and TaN.

9. A method of forming a graphene structure, the method comprising:
   preparing a substrate; and
   directly growing graphene on a surface of the substrate using a plasma enhanced chemical vapor deposition (PECVD) process, and the directly growing graphene including changing a surface energy of a graphene to provide a directly grown graphene having a controlled surface energy, wherein
   the changing the surface energy of the graphene includes at least one of injecting a doping gas during the directly growing graphene to form plasma of carbon precursor and dopant precursor, performing a plasma treatment after the directly growing graphene, and performing an UV-ozone treatment after the directly growing graphene and
   the directly grown graphene has a water contact angle of less than or equal to about 60 degrees with respect to the surface of the substrate,
   wherein the directly grown graphene has a domain size of greater than 0 nm and less than or equal to 100 nm.

10. The method of claim 9, wherein the directly growing graphene includes increasing the surface energy so the directly grown graphene has an increased surface energy.

11. The method of claim 9, wherein the directly grown graphene comprises an N component.

12. The method of claim 11, wherein the doping gas contains the N component and is injected into the graphene during the changing the surface energy of the graphene of the directly growing graphene.

13. The method of claim 12, wherein the doping gas comprises $NH_3$.

14. The method of claim 9, wherein
   the changing the surface energy of the graphene includes the performing the plasma treatment after the directly growing graphene, and
   the plasma treatment is performed with a gas containing the N component.

15. The method of claim 14, wherein the gas containing the N component comprises $NH_3$.

16. The method of claim 9, wherein the doping gas contains at least one of $NH_3$, $BH_3$, $B_2H_6$, $AsH_3$, $PH_3$, TMSb, TMIn, and TMGa.

17. The method of claim 9, wherein a doping concentration in the directly grown graphene is greater than 0% and less than or equal to 5% during the injecting the doping gas during directly grown the graphene.

18. The method of claim 9, wherein
   the changing the surface energy of the graphene includes the performing the plasma treatment after the directly growing graphene,
   the plasma treatment uses a gas with any one of $NH_3$, $H_2$, Ar, $O_2$, and two or more gas combinations thereof.

19. The method of claim 9, wherein the directly growing graphene is performed using a reaction gas including a mixed gas of carbon source gas, inert gas, and hydrogen gas.

20. The method of claim 9, further comprising:
   forming a material layer comprising any one of a metal and a dielectric material on the directly grown graphene having the controlled surface energy.

21. The method of claim 20, wherein
   the material layer comprises a metal layer or a dielectric layer, the metal layer includes at least one of W, Cu, Al, Hf, Zr, Fe, Ru, Rh, Ir, Mo, Co, Cr, V, Nb, Ta, Ti, TaN, and TiN, and the dielectric layer includes Si nitride or an oxide including at least one of Si, Ge, Al, Hf, Zr, and La.

22. The method of claim 9, wherein the water contact angle of the directly grown graphene is in a range of 20 degrees to 60 degrees with respect to the surface of the substrate.

23. The method of claim 9, wherein the substrate includes a semiconductor material, a metal material, or an inorganic insulating material, and the metal material includes at least one of W, Al, Hf, Zr, Fe, Ru, Rh, Ir, Mo, Co, Cr, V, Nb, Ta, Ti, TaN, and TiN.

24. A graphene structure comprising:

a substrate; and a directly grown graphene that is directly grown on a surface of the substrate and has a controlled surface energy, wherein the directly grown graphene has a water contact angle in a range of 20 degrees to 60 degrees with respect to the surface of the substrate, the directly grown graphene is doped, a doping concentration in the directly grown graphene is greater than 0% and less than or equal to 5%, and a dopant in the directly grown graphene includes an N component or a B component, provided the dopant does not include both the N component and the B component, wherein the directly grown graphene has a domain size of greater than 0 nm and less than or equal to 100 nm.

25. The graphene structure of claim 1, wherein the directly grown graphene comprises the N component.

26. The graphene structure of claim 24, wherein the substrate includes a semiconductor material, a metal material, or an inorganic insulating material, and the metal material includes at least one of Cu, Mo, Ni, Al, W, Ru, Co, Mn, Ti, Ta, Au, Hf, Zr, Zn, Y, Cr, Gd, Rh, Ir, Os, TiN and TaN.

* * * * *